United States Patent
Liao (10) Patent No.: US 10,485,129 B2
(45) Date of Patent: Nov. 19, 2019

(54) ELECTRICAL CONNECTOR EQUIPPED WITH DUAL LEVERS

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Fang-Jwu Liao, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 16/254,471

(22) Filed: Jan. 22, 2019

(65) Prior Publication Data

US 2019/0230807 A1 Jul. 25, 2019

(30) Foreign Application Priority Data

Jan. 23, 2018 (CN) ..................... 2018 2 0107694 U (51) Int. Cl.
*H01R 13/62* (2006.01)
*H05K 7/10* (2006.01)
*H01R 13/22* (2006.01)
*H01R 13/629* (2006.01)

(52) U.S. Cl.
CPC ........... *H05K 7/1007* (2013.01); *H01R 13/22* (2013.01); *H01R 13/62933* (2013.01)

(58) Field of Classification Search
CPC .. H05K 7/1007; H05K 7/1015; H05K 7/1023; H01R 13/22; H01R 13/62933
USPC ............................................ 439/73, 296, 331
See application file for complete search history.

(56) References Cited

U.S. PATENT DOCUMENTS 9,871,332 B2 * 1/2018 Liao .................. H01R 12/7076

FOREIGN PATENT DOCUMENTS

| CN | 202872102 U | 4/2013 |
| CN | 205724113 U | 11/2016 |
| TW | M550919 U | 10/2017 |

* cited by examiner

*Primary Examiner* — Khiem M Nguyen
(74) *Attorney, Agent, or Firm* — Wei Te Chung; Ming Chieh Chang (57) ABSTRACT

A connector includes an insulative housing, a plurality of contacts retained in the housing, and a metallic stiffener surrounding the housing. A first pivot section and a second pivot section respectively located at opposite rear and front ends of the stiffener. A first lever is pivotally mounted upon the first pivot section and a second lever is pivotally mounted upon the second pivot section. The first lever includes a first pivot mounted upon the first pivot section, and a first handle moveable between a closed position and an open position. The first pivot includes an offset section on which a load plate is pivotally mounted. The first pivot section includes a stopper limiting outward rotation of both the first lever and the load plate at more than ninety degrees so as not to hinder loading/unloading the CPU with regard to the housing in the vertical direction.

20 Claims, 12 Drawing Sheets

ELECTRICAL CONNECTOR EQUIPPED WITH DUAL LEVERS

BACKGROUND OF THE INVENTION

1. Field of the Invention

The present invention relates generally to an electrical connector, and more particularly to the electrical connector equipped with a pair of levers cooperating with a pivotal load plate to hole a CPU (Central Processing Unit) in a housing thereof so as to connecting the CPU to a printed circuit board on which the housing is seated.

2. Description of Related Arts

U.S. Pat. No. 9,871,332 discloses the dual-lever socket for use with the CPU. Anyhow, a stopper formed on the stiffener for limiting excessive outward rotation of the load plate may limit the outward movement of the operating lever, thus possibly interfering with the CPU during loading/unloading the CPU with regard to the housing of the connector and damaging the CPU.

An improved the dual-lever socket with safe operation is desired.

SUMMARY OF THE INVENTION

An object of the present invention is to provide an electrical connector for connecting a CPU to a printed circuit board. The connector includes an insulative housing, a plurality of contacts retained in the housing, and a metallic stiffener surrounding the housing. A first pivot section and a second pivot section respectively located at opposite rear and front ends of the stiffener. A first lever is pivotally mounted upon the first pivot section and a second lever is pivotally mounted upon the second pivot section. The first lever includes a first pivot mounted upon the first pivot section, and a first handle moveable between a closed position and an open position. The second lever has a second pivot mounted upon the second pivot section, and a second handle moveable between a closed position and an open position. The first pivot includes an offset section on which a load plate is pivotally mounted. The second pivot includes a pressing section downwardly abutting against a free end of the load plate. The first pivot section includes a stopper limiting outward rotation of both the first lever and the load plate at more than ninety degrees so as not to hinder loading/unloading the CPU with regard to the housing in the vertical direction.

The first pivot further includes a first angled end opposite to the first handle while the second handle further includes a second angle end opposite to the second handle and adjacent to the first angled end wherein the first angled end is configured and dimensioned to prevent inward movement of the second handle when the first handle is located at the closed position, thus assuring the operation procedure among the first lever, the second lever and the load plate during loading/unloading of the CPU with regard to the housing.

BRIEF DESCRIPTION OF THE DRAWING

FIG. 11(A)-11(D) show the operation procedure to open the load plate; and

FIG. 12(A)-12(D) show the operation procedure to close the load plate.

DETAILED DESCRIPTION OF THE PREFERRED EMBODIMENT

Referring to FIG. 1-12, an electrical connector assembly includes an electrical connector 100 mounted upon a printed circuit board 300 for connecting a CPU 200 to the printed circuit board 300. The connector 100 includes an insulative housing 1, a plurality of contacts (not shown) retained in the housing 1, and a metallic stiffener 2 surrounding the housing 1. The stiffener 2 includes a first/rear pivot section 21 and a second/front pivot section 22 opposite to each other in a front-to-back direction. A first/operation/hinge lever 3 is pivotally mounted upon the first pivot section 21, and a second/pressing/actuating lever 4 is pivotally mounted upon the second pivot section 22. The first lever 3 includes a first pivot 31 mounted upon the first pivot section 21, and a first handle 32 rotatable about the first pivot 31 and moveable between a (first) opening/unlocked/outermost position and a (first) closed/locked/horizontal position in a (first) vertical plane. In details, the closed position of the first lever 3 refers to the first handle 32 being locked by the corresponding locking tab 25. The first pivot 31 forms an offset section 311. Correspondingly, the first pivot section 21 forms a pair of upwardly protruding stoppers 211. When the first lever 3 is moved to the open position, the stopper 211 abuts against the offset section 311 for prohibiting further outward movement of the first lever 3, thus preventing any potential damage of the components on the printed circuit board 300 due to excessive outward movement of the first lever 3. Clearly, an angle between the close position and the open position of the first lever is larger than ninety degrees so as to allow the first lever 3 to rearwardly/outwardly extend in the open position for not hindering loading/unloading of the CPU with regard to the housing 1. Notably, the stopper 211 includes an outward offset structure 2110 so as to compromise the outward rotation of the offset section 311 of the first lever 3, thus allowing the aforementioned more than 90-degree rotation angle.

The load plate 5 is rotatable about the first pivot 311 between a (second) open/unlocked/outermost position and a (second) closed/locked/horizontal position. In fact, in this embodiment the load plate 5 can be located at two different horizontal positions depending upon the first lever 3 being located at the closed position or the open position. When the first lever 3 is located at the closed portion, the load plate 5 is located at the front horizontal position to be completely pressed by the second lever 4; when the first lever 3 is located at the open position, the load plate 5 is located at the rear horizontal position to be freed from the second lever 4 thus allowing freely outward/upward rotation of the load plate 5. In details, when the load plate 7 is moved to the outermost open position, the upper end 2111 of the stopper 211 abuts upwardly against the load plate 5 for prohibiting the load plate 5 from further outward moving, thus preventing any potential damage of the components on the printed circuit board 300 due to excessive outward movement of the load plate 5.

The stiffener 2 is essentially of a frame structure surrounding the housing 1 and includes a first/rear side 210 and a second/front side 220 where the first pivot section 21 and the second pivot section 22 are located. The first pivot section 21 further includes a pair of mounting regions 20 each having an outer part 201 and an inner part 202 so as to have the first pivot 3 received therein. The stiffener further includes a pair of lateral sides 230, 240 perpendicular to the first/second sides 210, 220. Each of the lateral sides 230, 240 includes the corresponding locking tab 25 thereon for engagement with the first handle 32 and the second handle 42 of the corresponding first lever 3 and second lever 4, respectively.

The second lever 4 includes a second pivot 41 mounted upon the second pivot section 22, and a second handle 42 rotatable about the second pivot 41 and moveable between a (second) open/unlocked/outermost position and a (second) closed/locked/horizontal position in a (second) vertical plane. A pressing section 411 in an offset configuration, is formed on the second pivot 41. The second pivot section 22 also has a pair of mounting regions 20 each having an outer part 201 and an inner part 202 so as to have the second pivot 4 received therein.

The load plate 5 includes a main body 50, a fixing section 51 at a rear end for mounting to the offset section 311 of the first lever 3, and a free section 52 located at a front end and adapted for being pressed by the pressing section 411 of the second lever 4. The stopper 211 abuts against a root portion of the main body 50 around the fixing section 51 when the load plate 5 is moved to an outermost open position.

In brief, the stopper 211 not only limits an outward movement of the load plate 5 by the upper end 2111 and that of the first lever 3 by the outward offset 2110 wherein the maximum outward rotation angle of the load plate 5 is around 150 degrees relative to the closed position while the maximum outward rotation angle of the first lever 3 is around 120 degrees relative to the closed position. With this arrangement, when in the open positions, both the load plate 5 and the first lever 3 are sufficiently limited for not damaging the components on the printed circuit board 300 on one hand, while being also open sufficiently wide for not hindering loading/unloading the CPU with regard to the housing 1 on the other hand. Understandably, in this embodiment the stopper 211 is a one piece design; alternately, the stopper may include two separate parts physically, of which one limits rotation of the load plate and other limits rotation of the first lever.

Figure 1:
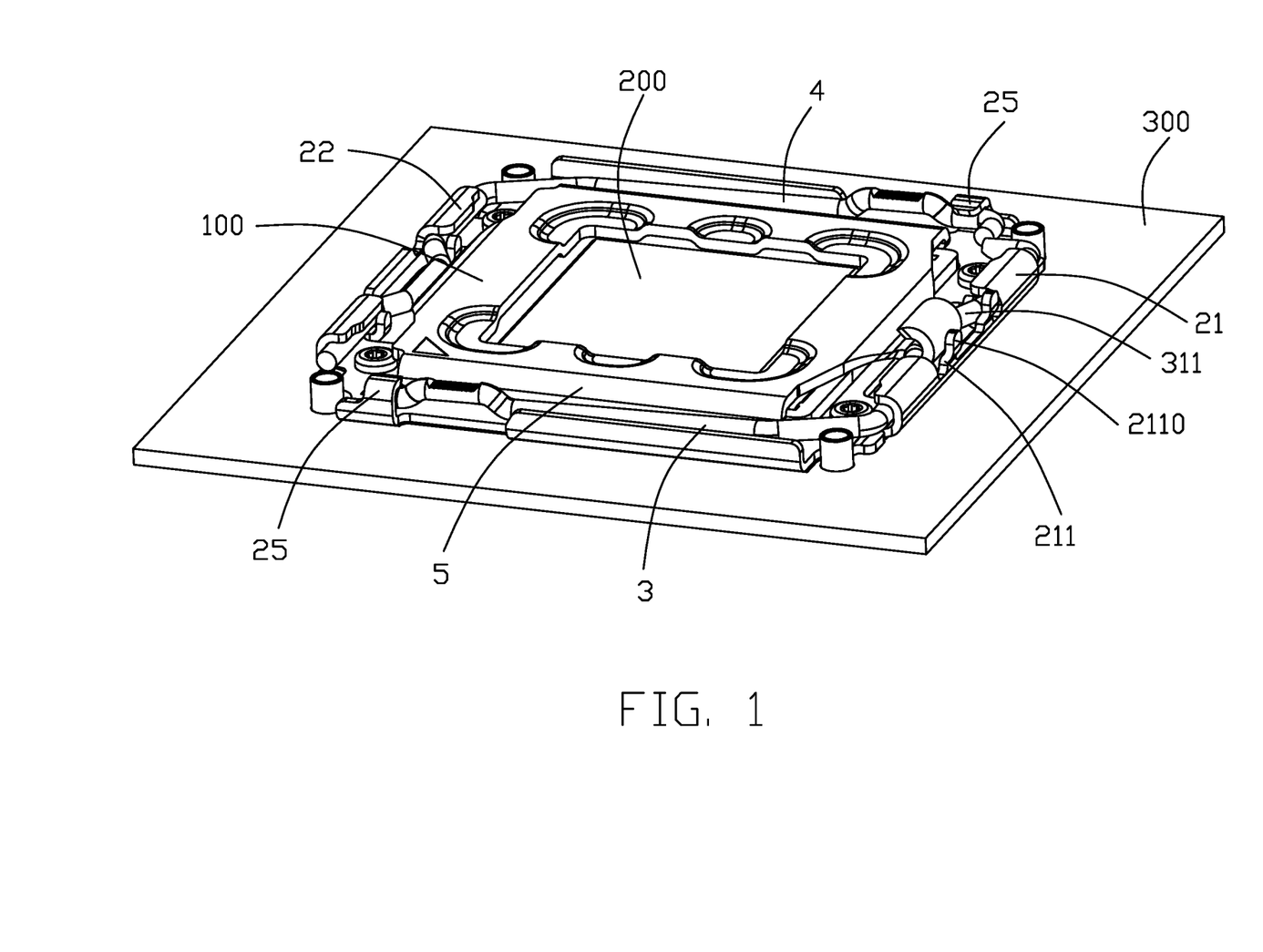
FIG. 1 is a perspective view of an electrical connector assembly according to the present invention.
Figure 2:
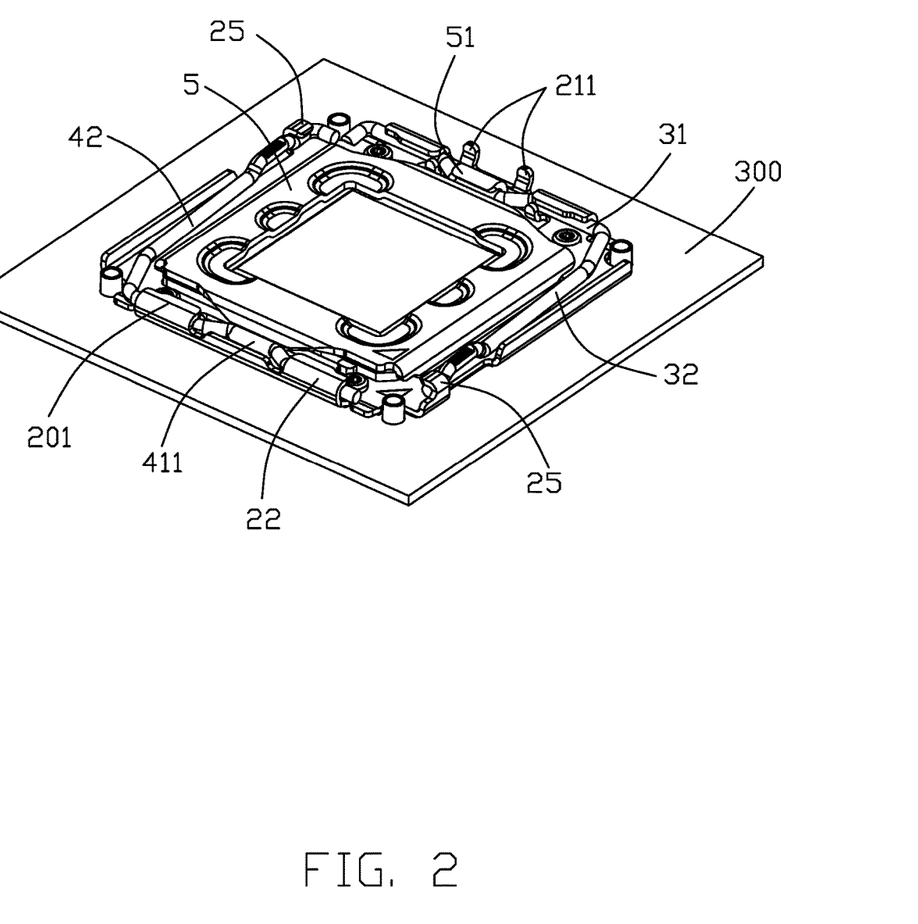
FIG. 2 is another perspective view of the electrical connector assembly of FIG. 1.
Figure 3:
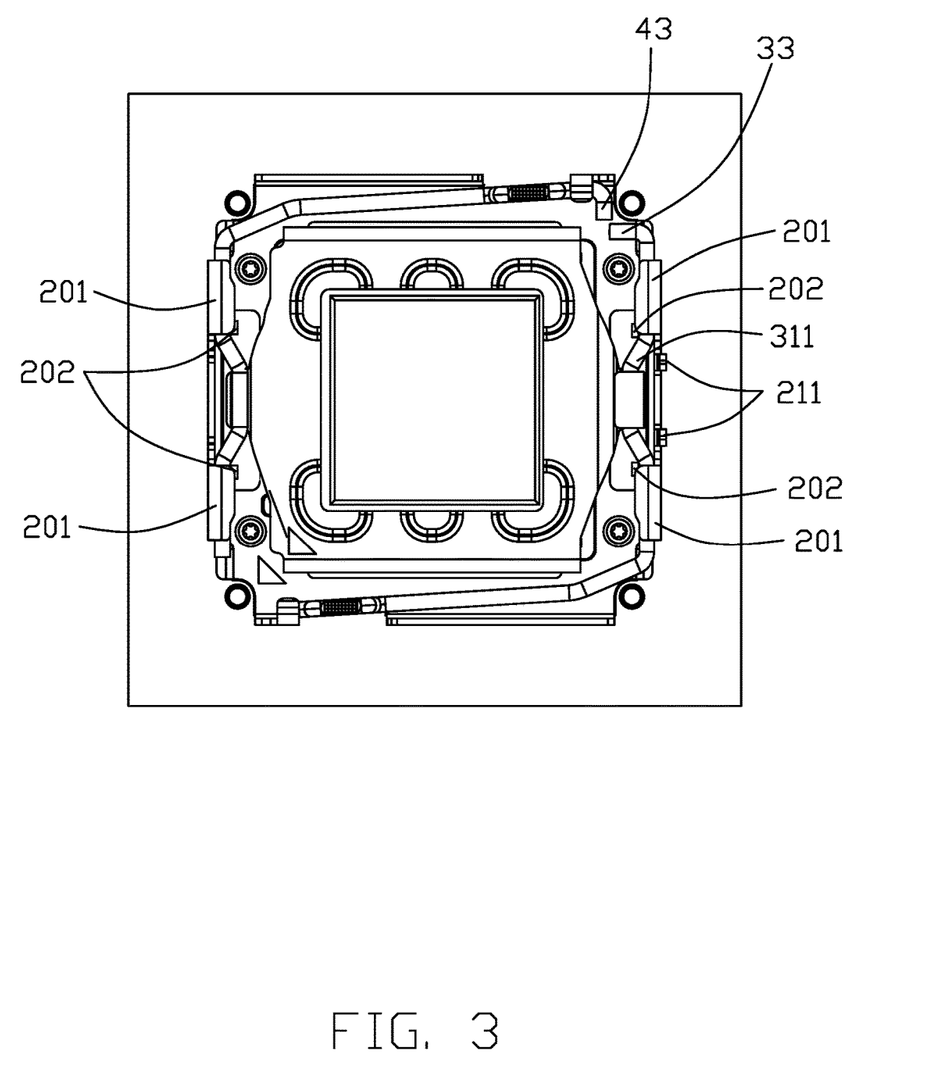
FIG. 3 is a top view of the electrical connector assembly of FIG. 1.
Figure 4:
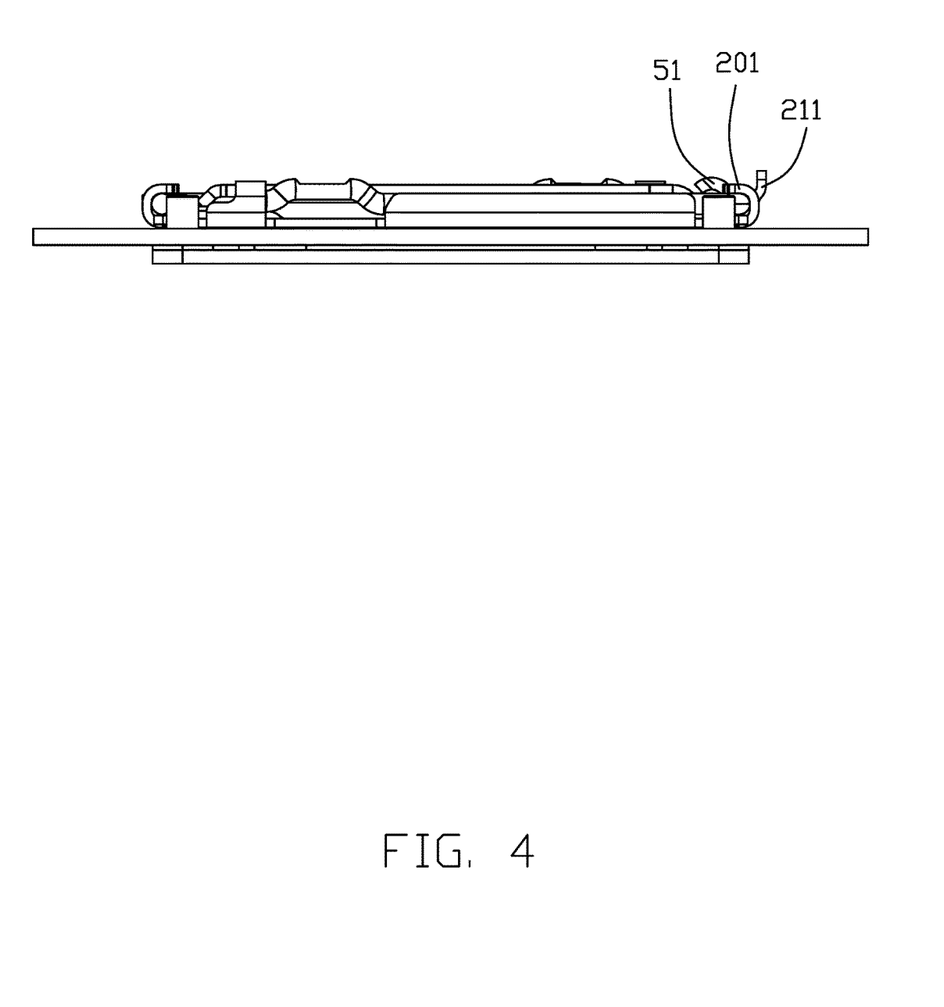
FIG. 4 is a side view of the electrical connector assembly of FIG. 1.
Figure 5:
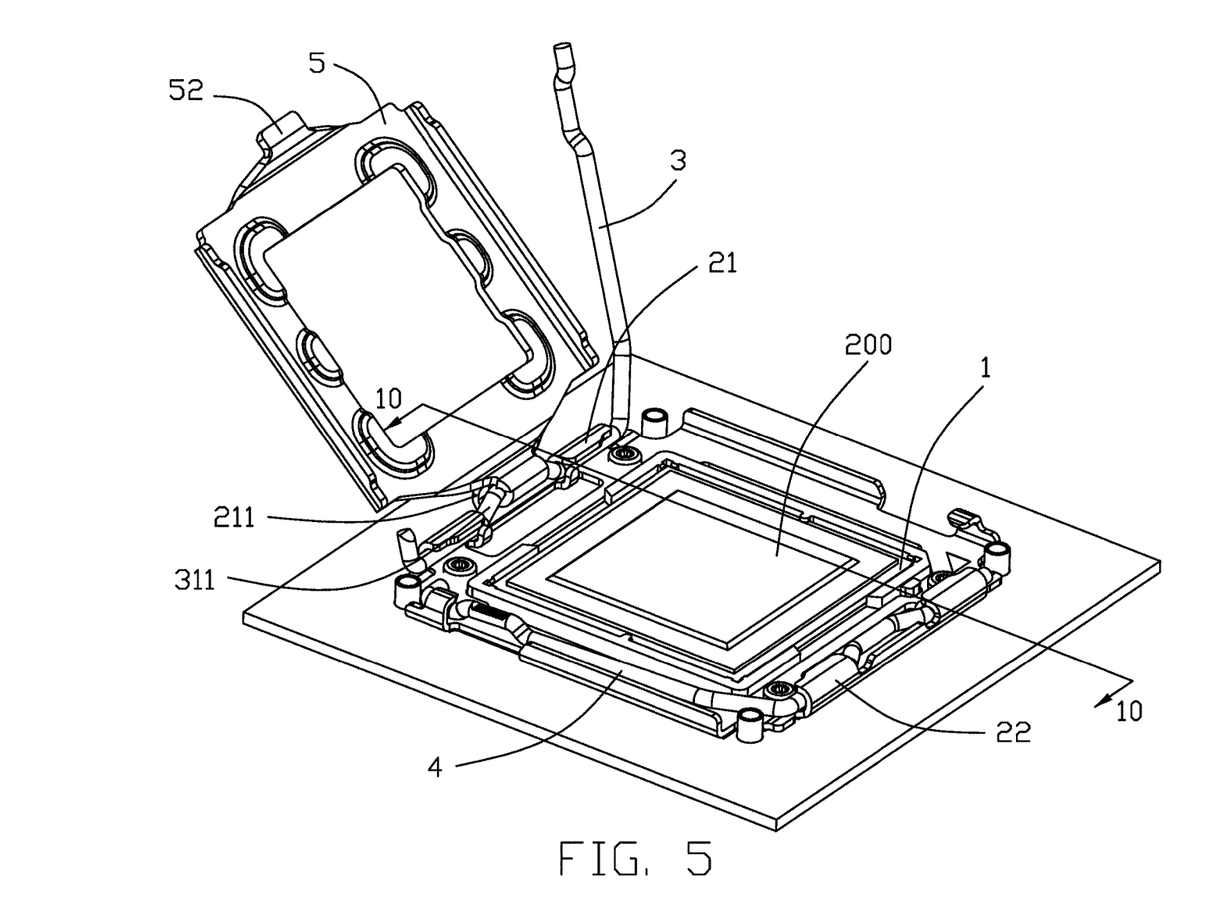
FIG. 5 is a perspective view of the electrical connector assembly of FIG. 1 wherein the first lever is moved to an open position and the load plate is also moved to an open position so as to allow the CPU to be loaded/unloaded with regard to the housing.
Figure 6:
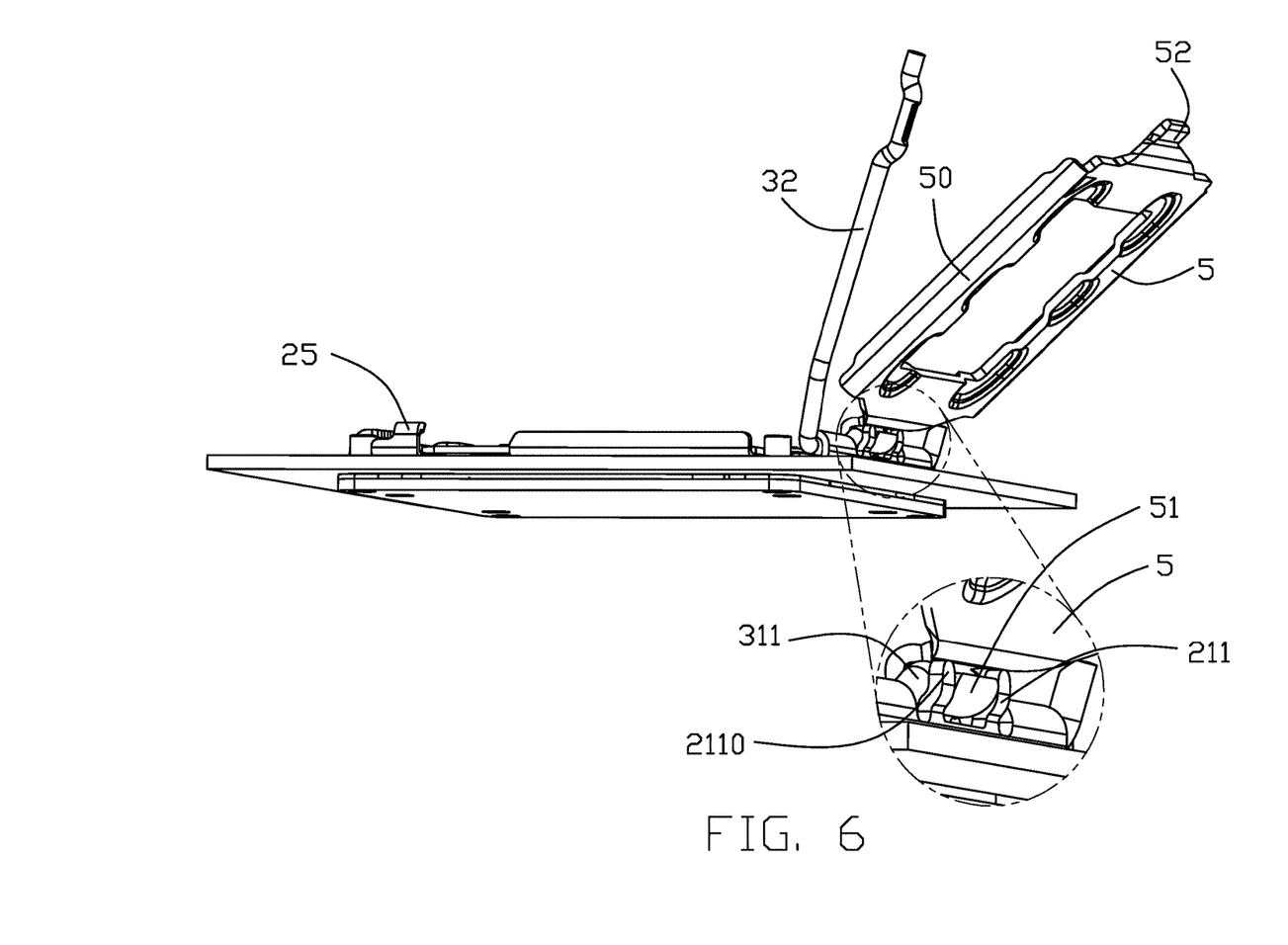
FIG. 6 is another perspective view of the electrical connector assembly of FIG. 5 to show how the stopper limits outward movements of both the first lever and the load plate.
Figure 7:
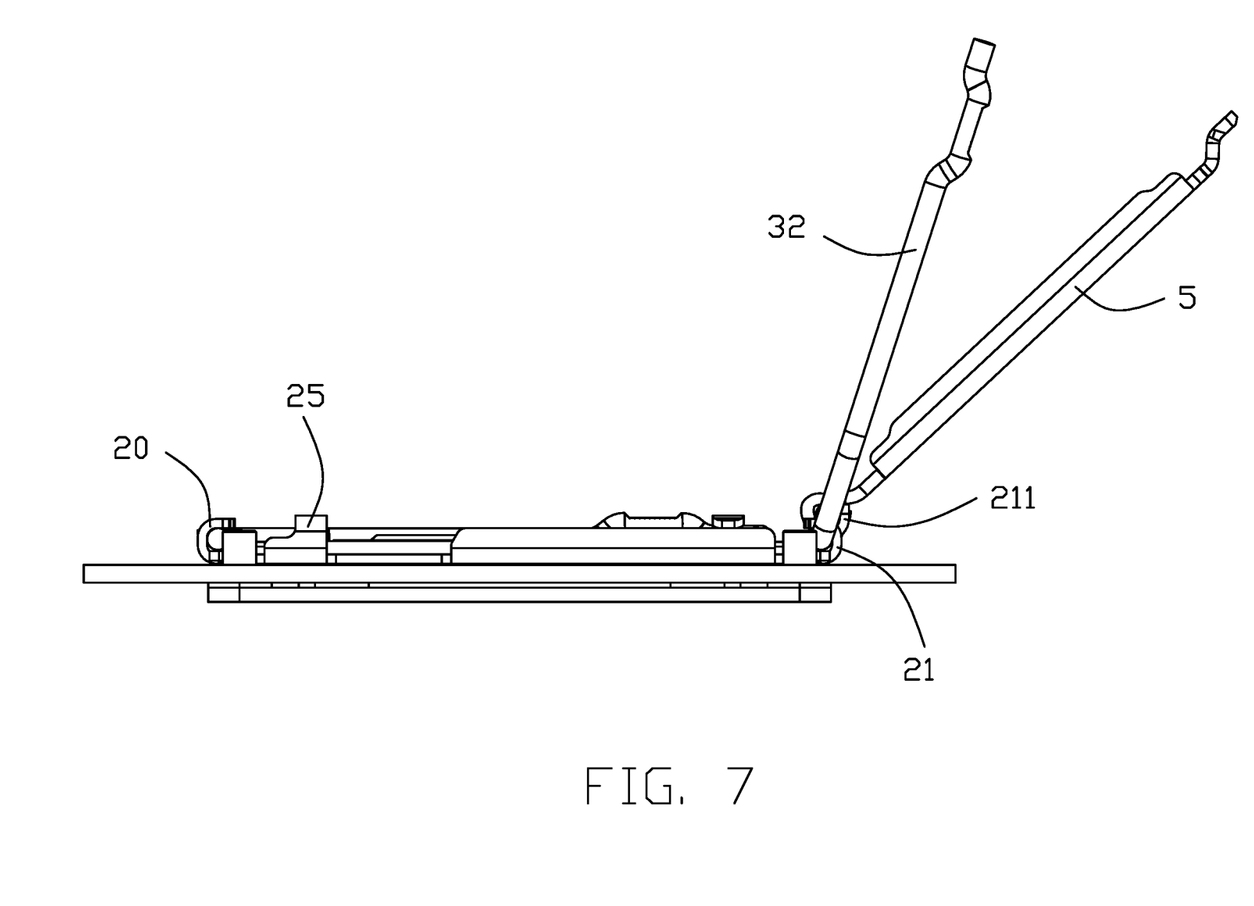
FIG. 7 is a side view of the electrical connector assembly of FIG. 5.
Figure 8:
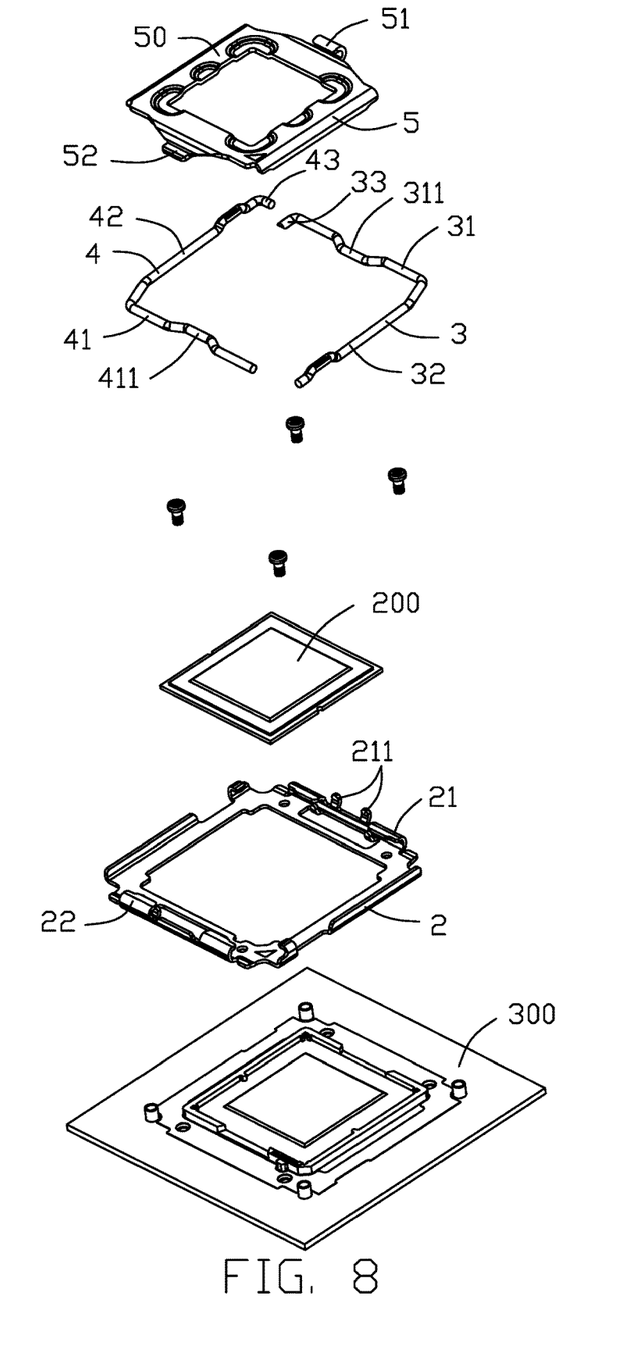
FIG. 8 is an exploded perspective view of the electrical connector assembly of FIG. 1.
Figure 9:
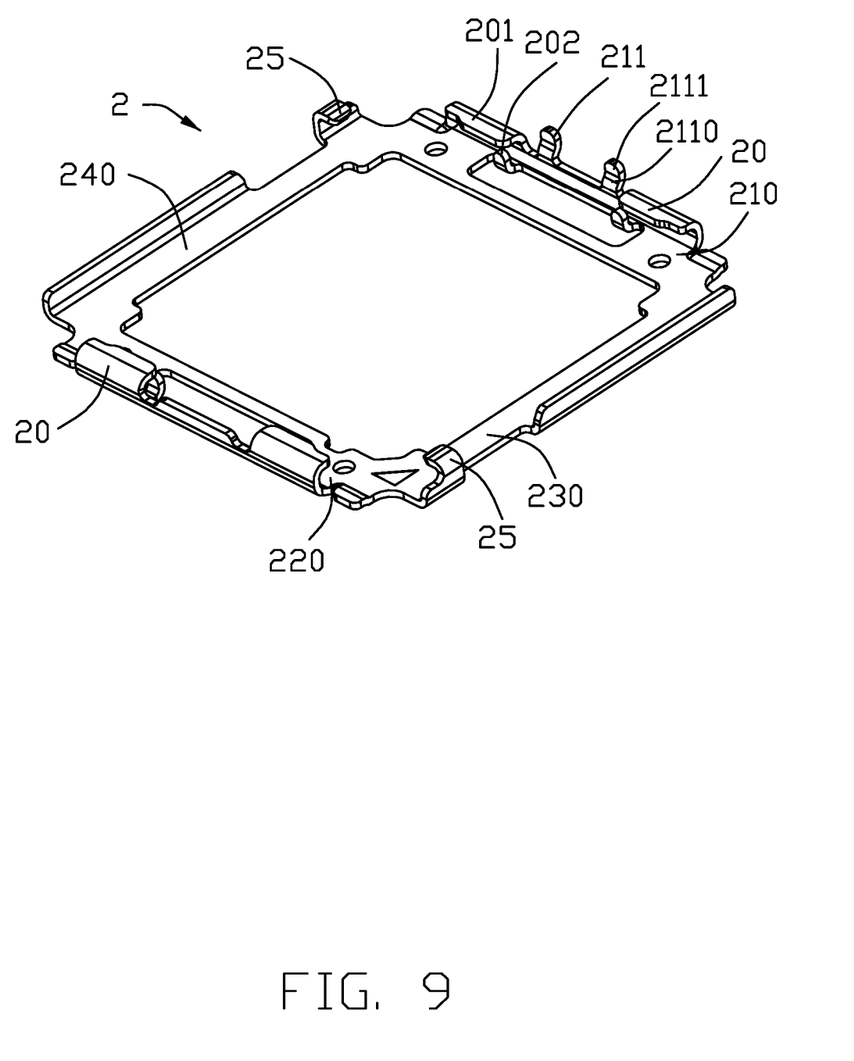
FIG. 9 is a perspective view of the stiffener of the electrical connector assembly of FIG. 1.
Figure 10:
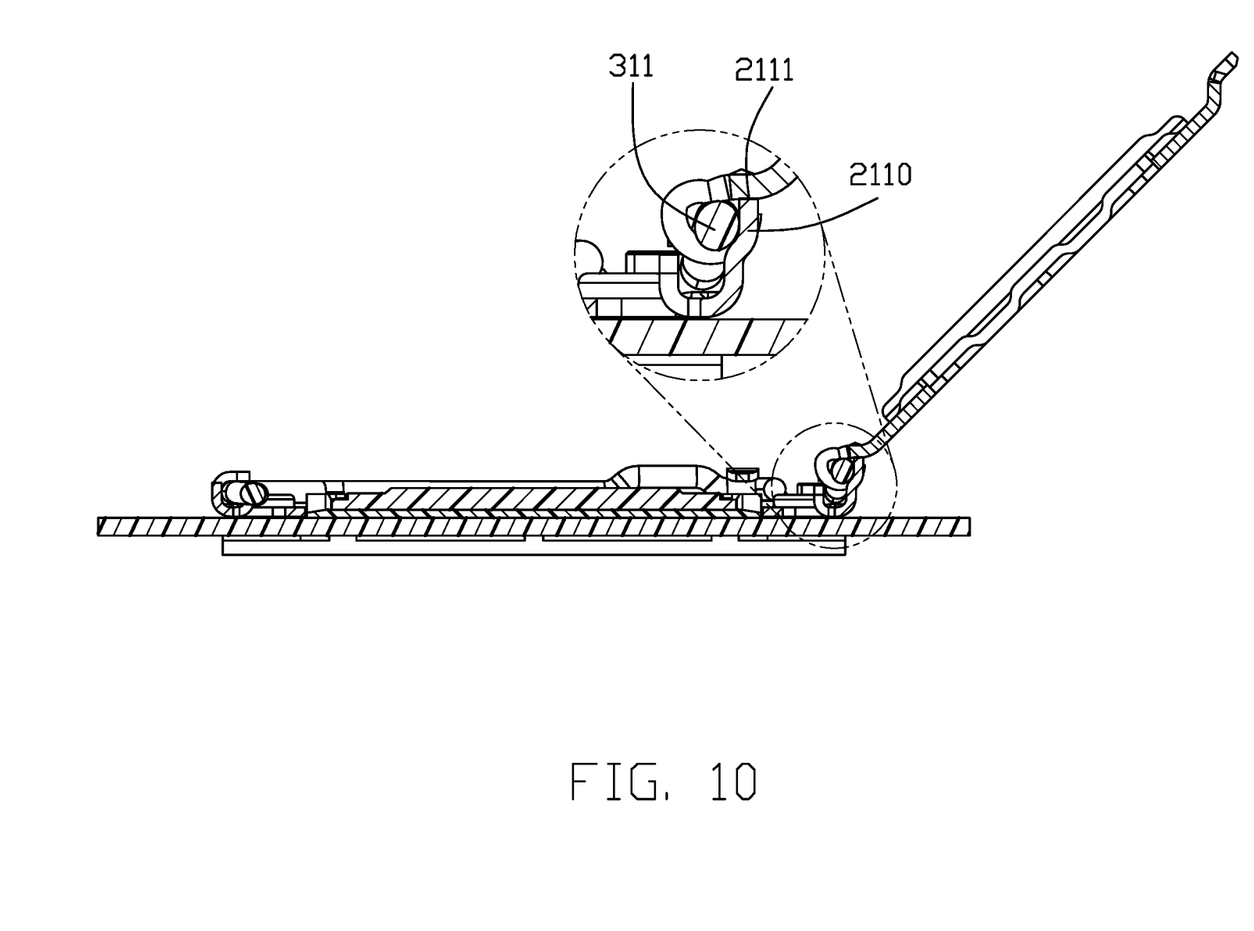
FIG. 10 is a cross-sectional view of the electrical connector assembly of FIG. 6 to show how the stopper limits an outward/rearward movement of the load plate and that of the first lever.
Figure 11A:
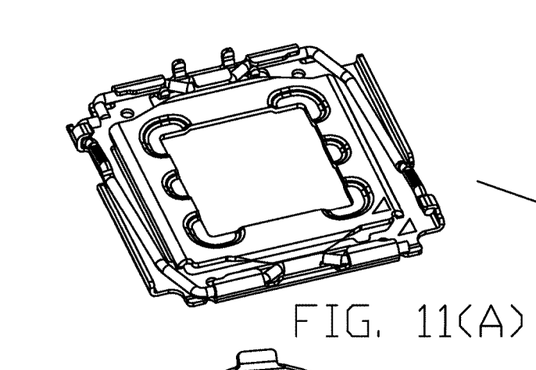
Figure 11B:
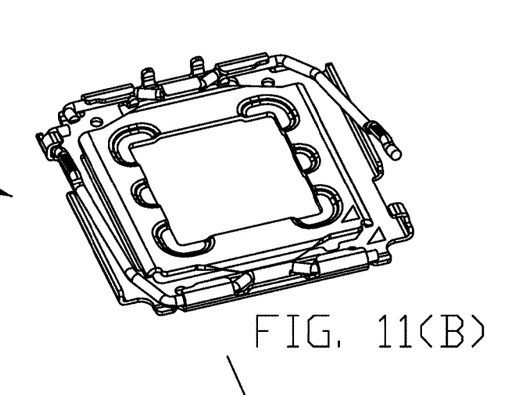
Figure 11C:
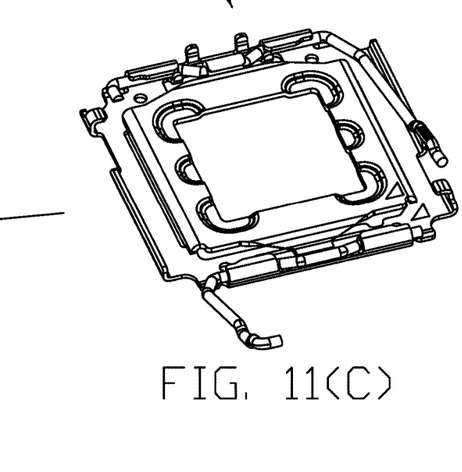
Figure 11D:
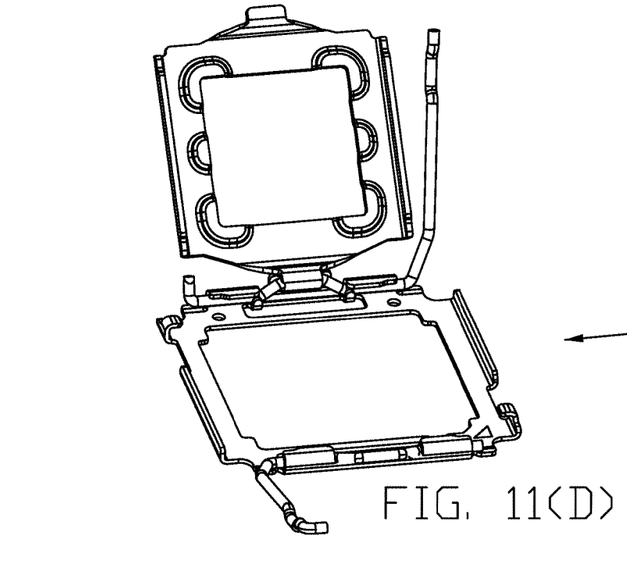
Figure 12A:
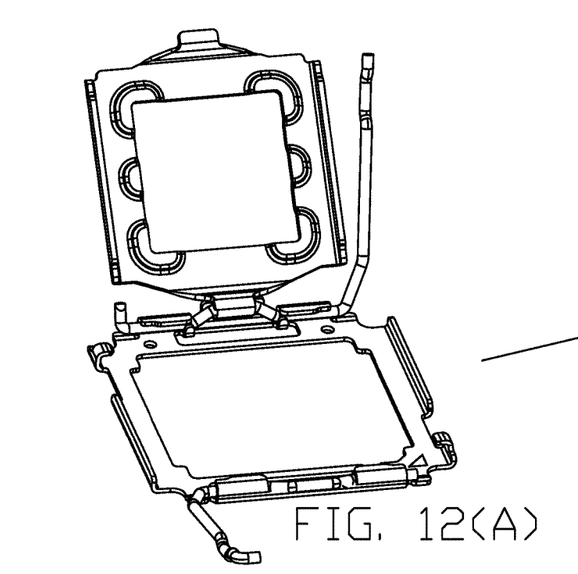
Figure 12B:
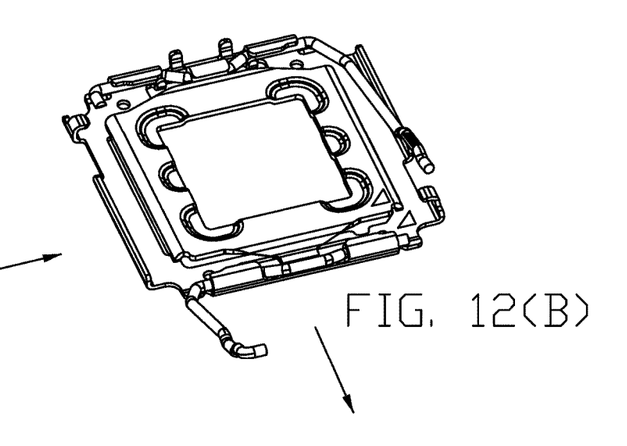
Figure 12C:
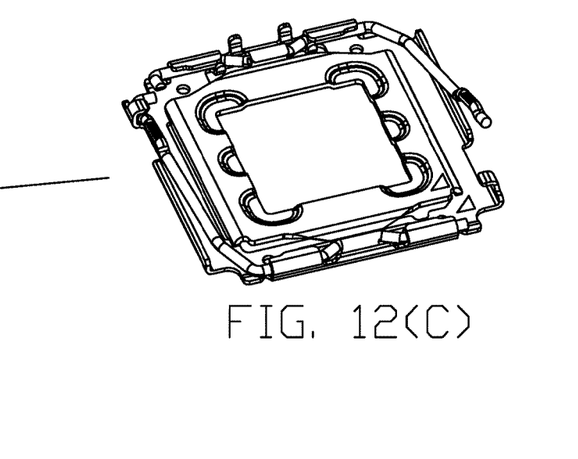
Figure 12D:
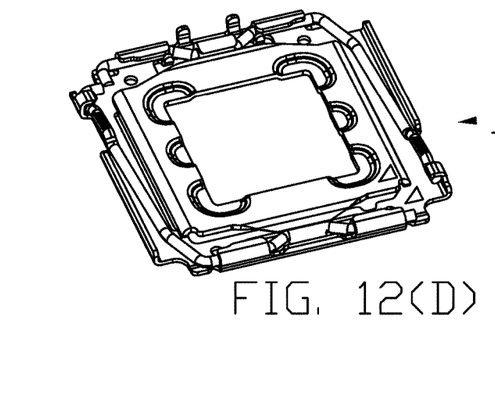

In this embodiment, as shown in FIGS. 11(A)-11(D), the operation procedure for opening/unlocking the load plate 5 includes the sequential steps: (i) unlocking the first lever 3 by having the first lever 3 moved from the closed/horizontal position to an intermediate/oblique position; (ii) unlocking the second lever 4 by having the second lever 4 moved from the closed/horizontal position to the open position; and (iii) lifting up the load plate 5 from the closed position to the open position. Understandably, when the load plate 5 is rearwardly and upwardly moved, the first lever 3 is also moved rearwardly to the open position associatively because the linkage therebetween by the offset section 311 of the first lever 3 and the fixing section 51 of the load plate 5. It is also noted that the reason why in FIG. 11(B) the first lever 3 can not rotated to an upright position or a fully open position, is the linkage between the load plate 5 and the first lever 3. At the stage shown in FIG. 11(B), the free section 52 of the load plate 5 is still pressed by/engaged with the pressing section 411 of the second lever 4 so that the load plate 5 cannot be completely released from the locking position even if the fixing section 51 is slightly upwardly moved due to unlocking of the first lever 3. Oppositely, FIGS. 12(A)-12(D) show the reverse operation procedure for locking/closing the load plate 5.

Notably, the second lever 4 is locked in the closed position unless the second handle 42 is inwardly and sideward moved to be disengaged from the locking tab 25. Therefore, in this embodiment, the free end 33 of the first pivot 31 of the first lever 3 can be intentionally angled and dimensioned/lengthened to block inward movement of the free end 43 of the second handle 42 of the second lever 4 when the first lever 3 is located at the closed position, thus assuring the second lever 4 can not be operated between the closed position and the open position unless the first lever 3 is moved from the closed position to the open position. This foolproof mechanism assures the correct operation procedure, i.e., the sequential steps of rotation of the first lever 3, rotation of the second lever 4 and rotation of the load plate 5, with no possibilities to damage the related parts due to incorrect operation procedure. Understandably, the dimension and the configuration of the free end 43 of the second handle 42 of the second lever 4 also need to compliantly cooperate with the free end 33 of the first pivot 31 of the first lever 3 for assuring this foolproof function.

In an alternate embodiment, the free end 52 of the load plate 5 may be shortened and flattened so that the operation procedure of the invention for loading/unloading the CPU with regard to the housing 1 of the connector 100 may be involved with only the first lever 3 and the load plate 5. In other words, the second lever 4 may be constantly retained in the horizontal locked position. In such a situation, for unloading the CPU from the housing 1 of the connector 100, firstly the first lever 3 is rotated from the closed position to the open position so as to have the free section 52 backward moved and substantially completely freed from the pressing section 411 of the second lever 4, and successively the load plate 5 is rotated from the horizontal position to the open position to expose the housing upward. Loading of the CPU is operated in a reversed procedure.

Understandably, in this alternate design, the second lever 4 can be replaced by the retention device such as a retention slot formed in or a locking knob formed on the front end wall of the stiffener 2 to reduce the manufacturing cost or simplifying the structures thereof, as long as such a retention device may downwardly pressing the fee section 52 of the load plate 5 in position. Anyhow, theoretically speaking, the first embodiment operated as shown in FIGS. 11(A)-11(D) and FIGS. 12(A)-12(D) is superior to the alternate embodiment because the former may have a more delicate associative movement of the load plate between the open position and the closed position than the latter, thus perfecting pressing function of the load plate and assuring the electrical connection between the CPU and the contact in the housing.

What is claimed is:

1. An electrical connector comprising:
   an insulative housing dimensioned and configured for receiving an electronic package therein and mounting to a printed circuit board;
   a metallic stiffener at least partially surrounding the housing and defining a first pivot section at a rear end and a second pivot section at a front end opposite to each other in a front-to-back direction;
   a first lever including a first pivot pivotally mounted upon the first pivot section, and a first handle moveable in a first vertical plane between a first open position and a first closed position, an offset section formed on the first pivot of the first lever;
   a second lever including a second pivot pivotally mounted upon the second pivot section, and a second handle moveable in a second vertical plane between a second open position and a second closed position; and
   a load plate pivotally mounted upon the offset section and moveable between an open position and a closed position; wherein
   the first pivot section forms at least an upstanding stopper restricting both the load plate and the first lever from excessively rearwardly/outwardly moving while allowing more than ninety degrees rotation of the load plate between the open position and the closed position, as well as of the first lever between the first open position and the first closed position, thus assuring loading/unloading the electronic package with regard to the housing without interference against either the load plate and the first lever.

2. The electrical connector as claimed in claim 1, wherein the load plate abut against an upper end of the stopper when said load plate is in an maximum open position.

3. The electrical connector as claimed in claim 2, wherein the load plate downwardly abuts against the upper end of the stopper in a vertical direction perpendicular to the front-to-back direction.

4. The electrical connector as claimed in claim 1, wherein the offset section of the first lever abuts rearwardly against an outwardly offset structure of the stopper in the front-to-back direction.

5. The electrical connector as claimed in claim 1, wherein a maximum rotation angle of the load plate is larger than a maximum rotation angle of the first lever.

6. The electrical connector as claimed in claim 1, wherein there are two upstanding stoppers on the first pivot section and symmetrically arranged with the offset section.

7. The electrical connector as claimed in claim 1, wherein the load plate forms, in the front-to-back direction, a fixing section at a rear end to mount upon the offset section, and a free section at a front end to be pressed by a pressing section formed on the second pivot.

8. The electrical connector as claimed in claim 7, wherein said free end is disengaged from the pressing section when the first handle of the first lever is moved from the first closed position to the first open position.

9. The electrical connector as claimed in claim 7, wherein the stiffener has a locking tab engaged with the second handle of the second lever, and the second handle is required to move inwardly and sideward to be disengaged from the locking tab.

10. The electrical connector as claimed in claim 9, wherein the first pivot of the first lever forms a first angled end section, and the second handle of the second lever forms a second angled end section intimate confronting the first angled end section so that the second handle cannot be inwardly and sidewardly for disengagement from the locking tab unless the first handle of the first lever is moved from the first closed position to the first open position.

11. An electrical connector comprising:
    an insulative housing dimensioned and configured for receiving an electronic package therein and mounting to a printed circuit board;
    a metallic stiffener at least partially surrounding the housing and defining a first pivot section at a rear end and a second pivot section at a front end opposite to each other in a front-to-back direction;
    a first lever including a first pivot pivotally mounted upon the first pivot section, and a first handle moveable in a first vertical plane between a first open position and a first closed position, an offset section formed on the first pivot of the first lever, a first angled end section formed on the first lever;
    a second lever including a second pivot pivotally mounted upon the second pivot section, and a second handle moveable in a second vertical plane between a second open position and a second closed position, a second angled end section formed on the second handle;
    a locking tab formed on the stiffener to retain the second handle in position; and
    a load plate pivotally mounted upon the offset section and moveable between an open position and a closed position; wherein
    both said first end section and said second end section are configured and dimensioned to have the first end section and the second end section closely confronting each other when both the first handle of the first lever in the first closed position and the second handle of the second lever in the second closed position so as not to allow the second handle to be inwardly and sideward moved to be unlocked from the locking tab unless the first handle of the first lever is already moved from the first closed position to the first open position.

12. The electrical connector as claimed in claim 11, wherein the stiffener forms a stopper adapted to abut against both the load plate and the first lever when both the load plate is located in the open position, and the first handle of the first lever is moved to the first open position.

13. The electrical connector as claimed in claim 12, wherein a rotation angle of the first lever is more than ninety degrees between the first open position and the first closed position.

14. The electrical connector as claimed in claim 13, where a rotation angle of the load plate is larger than that of the first lever.

15. The electrical connector as claimed in claim 12, wherein said stopper includes an outwardly offset structure to forwardly abut against the first lever in the front-to-back direction.

16. The electrical connector as claimed in claim 15, wherein said outwardly offset structure forwardly abuts against the offset section of the first pivot of the first lever.

17. An electrical connector comprising:
    an insulative housing dimensioned and configured for receiving an electronic package therein and mounting to a printed circuit board;
    a metallic stiffener at least partially surrounding the housing and defining a rear end and a front end opposite to each other in a front-to-back direction, wherein a first pivot section is formed on the rear end;

a first lever including a first pivot pivotally mounted upon the first pivot section, and a first handle moveable in a first vertical plane between a first open position and a first closed position, an offset section formed on the first pivot of the first lever;

a load plate including a front free section and a rear fixing section opposite to each other in the front-to-back direction wherein said rear fixing section pivotally mounted upon the offset section and moveable between an open position and a closed position; and a retention device located around the front end of the stiffener and adapted to downwardly press the free section of the load plate when the load plate is moved to the closed position; wherein the first pivot section forms at least an upstanding stopper restricting both the load plate and the first lever from excessively rearwardly/outwardly moving while allowing more than ninety degrees rotation of the load plate between the open position and the closed position, as well as of the first pivot between the first open position and the first closed position, thus assuring loading/unloading the electronic package with regard to the housing without interference against either load plate and the first lever.

18. The electrical connector as claimed in claim 17, wherein the retention device is a pressing section formed on a second lever which is pivotally mounted upon the front end of the stiffener.

19. The electrical connector as claimed in claim 18, wherein a rotation angle of the load plate between the open position and the closed position, is larger than another rotation angle of the first lever between the first open position and the first closed position.

20. The electrical connector as claimed in claim 18, wherein the stopper forms an outward offset structure against which the offset section of the first lever abuts rearwardly when said first lever is moved to the open position.

\* \* \* \* \*